United States Patent
Fan

(10) Patent No.: US 7,815,454 B2
(45) Date of Patent: Oct. 19, 2010

(54) ELECTRICAL CONNECTOR

(75) Inventor: Chia-Wei Fan, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/380,869

(22) Filed: Mar. 3, 2009

(65) Prior Publication Data

US 2009/0221159 A1    Sep. 3, 2009

(30) Foreign Application Priority Data

Mar. 3, 2008    (TW) .............................. 97203555 U

(51) Int. Cl.
 *H01R 13/62*    (2006.01)
(52) U.S. Cl. ........................................ 439/331; 439/71
(58) Field of Classification Search .................. 439/70, 439/71, 73, 330, 331, 342
See application file for complete search history.

(56) References Cited

U.S. PATENT DOCUMENTS

| | | |
|---|---|---|
| 7,001,197 B2 | 2/2006 | Shirai |
| 7,014,489 B2 * | 3/2006 | Ma .............................. 439/331 |
| 7,153,154 B2 * | 12/2006 | Ma et al. ..................... 439/331 |
| 7,179,109 B1 * | 2/2007 | Ma .............................. 439/331 |

FOREIGN PATENT DOCUMENTS

CN    2669406    1/2005

* cited by examiner

*Primary Examiner*—Thanh-Tam T Le
(74) *Attorney, Agent, or Firm*—Andrew C. Cheng; Wei Te Chung; Ming Chieh Chang

(57) ABSTRACT

An electrical connector for electrically connecting a chip module to a printed circuit board includes an insulative housing with a number of contacts, a metal stiffener surrounding the insulative housing, a metal clip pivotally assembled to one end of the metal stiffener; and a lever pivotally assembled to the other end of the metal stiffener. The metal clip has a main portion, an engaging tab extending angularly from the main portion, and a pair of hooks mounting to the metal stiffener. The metal stiffener includes a block portion engaging with the main portion to avoid the tab disengaging from the lever.

11 Claims, 2 Drawing Sheets

ELECTRICAL CONNECTOR

BACKGROUND OF THE INVENTION

1. Field of the Invention

The present invention generally relates to an electrical connector, and more particularly to an electrical connector for removable mounting a chip module to a printed circuit board.

2. Description of Related Art

Connectors for mounting a chip module, such as a Central Processing Unit (CPU), to a printed circuit board are widely used in electrical equipments. Such a connector usually includes a base, a plurality of contacts retained in the base, a fastening frame partially surrounding the housing, a metal clip and an operational lever attached to the fastening frame. The base has a mounting surface to which the chip module is mounted and a connecting surface attached to the printed circuit board.

U.S. Pat. No. 7,001,197 issued to Shirai on Feb. 21, 2006 typically discloses another type of connector socket, and which can be generally called LGA socket. As clearly shown in Figures, the socket generally includes a metal stiffener with a housing securely supported therein. Then a metal clip is pivotally assembled to the stiffener. On the other hand, a clip is pivotally assembled to the other side of the stiffener and when the clip is closed to the stiffener, the lever having a cam can lock the clip to a closed position. By this arrangement, if before the clip is closed, and a CPU is seated on the housing, then the clip will tightly press the CPU toward the housing ensuring proper electrical connection therebetween.

Two opposite edges of the base respectively upward extend to form a mounting portion for pivotally mounting the metal clip and a receiving portion for pivotally receiving the lever. The metal clip is provided with an engaging tab adjacent to the receiving portion of the base for locking with the lever. When mounting, the connector is mounted to the printed circuit board, then the chip module is assembled to the mounting surface of the base and the metal clip is rotatably to partially cover the chip module, finally rotating the operational lever to a closed position for pushing the chip module against the base. The contacts retained in the base facilitate the electrical connection between the chip module and the printed circuit board.

However, the connector with above structures has at least the shortcomings as follows: When rotating the lever to close the metal clip, the lever effect a resultant force on the engaging tab of the metal clip, and the resultant force can be resolved into a horizontal force and a vertical force acted on the tab. The horizontal force pushes the tab to move towards the mounting portion of the base whereby the lever disengages from the tab. Therefore, the metal clip couldn't lock with the lever smoothly.

Therefore, it is desired to provide an improved electrical connector to stress the problems mentioned above.

BRIEF SUMMARY OF THE INVENTION

Accordingly, an object of the present invention is to provide an electrical connector with improved structure for preventing the displacement of a metal clip thereof during operation.

In order to achieve the object discussed above, an electrical connector for electrically connecting a chip module to a printed circuit board, comprises an insulative housing defining a plurality of contact-receiving passageways penetrating therethrough, a plurality of contacts received in the contact-receiving passageways of the insulative housing, a metal stiffener surrounding the insulative housing and comprising a base plate with a window in the center thereof, a metal clip pivotally assembled to one end of the metal stiffener; and a lever pivotally assembled to the other end of the metal stiffener. The metal clip comprises a main portion, an engaging tab extending angularly from the main portion, and a pair of hooks opposite to the engaging tab and mounting to the metal stiffener. The lever has a cam portion engaging with engaging tab of the metal clip. The metal clip includes an extending portion adjacent to the hook and the metal stiffener includes a block portion abutting against the extending portion.

Other objects, advantages and novel features of the invention will become more apparent from the following detailed description of the present embodiment when taken in conjunction with the accompanying drawings.

DETAILED DESCRIPTION OF THE INVENTION

Figure 1:
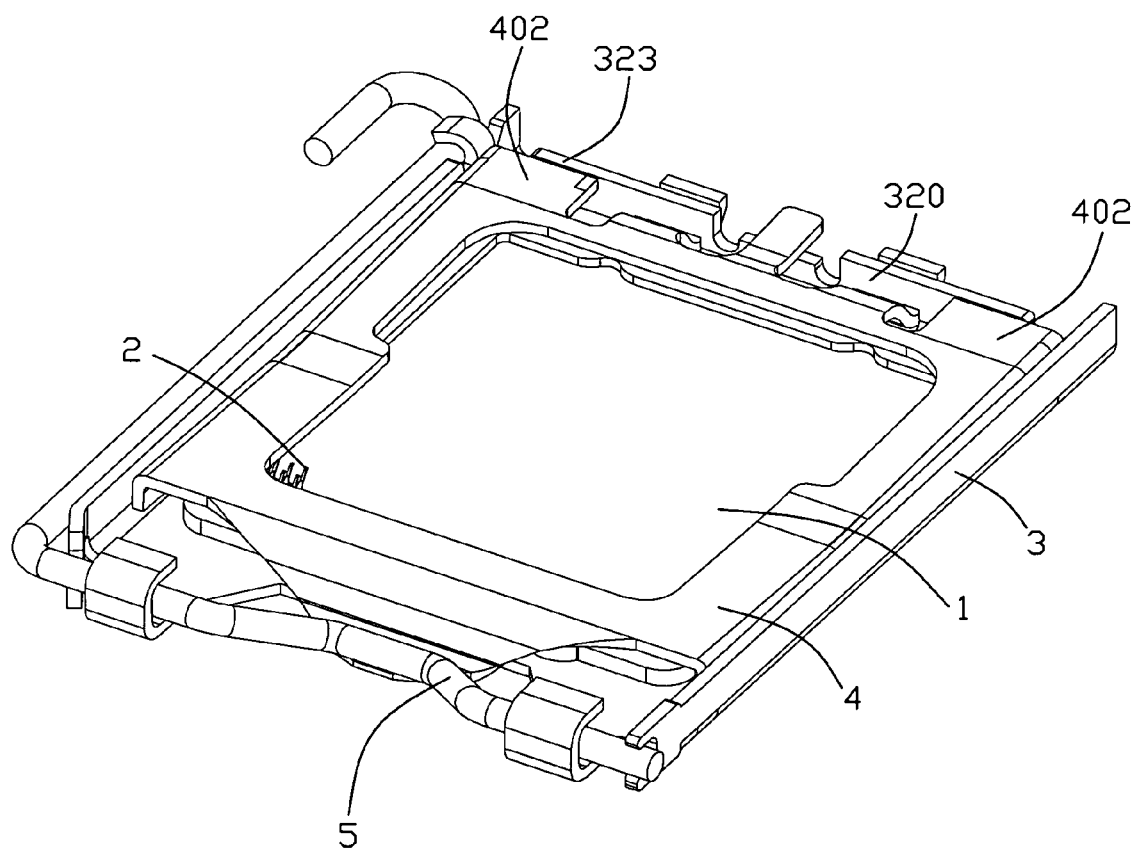
FIG. 1 is an assembled, perspective view of an electrical connector in accordance with the present invention.

Reference will now be made to the drawing figures to describe the present invention in detail.

Figure 2:
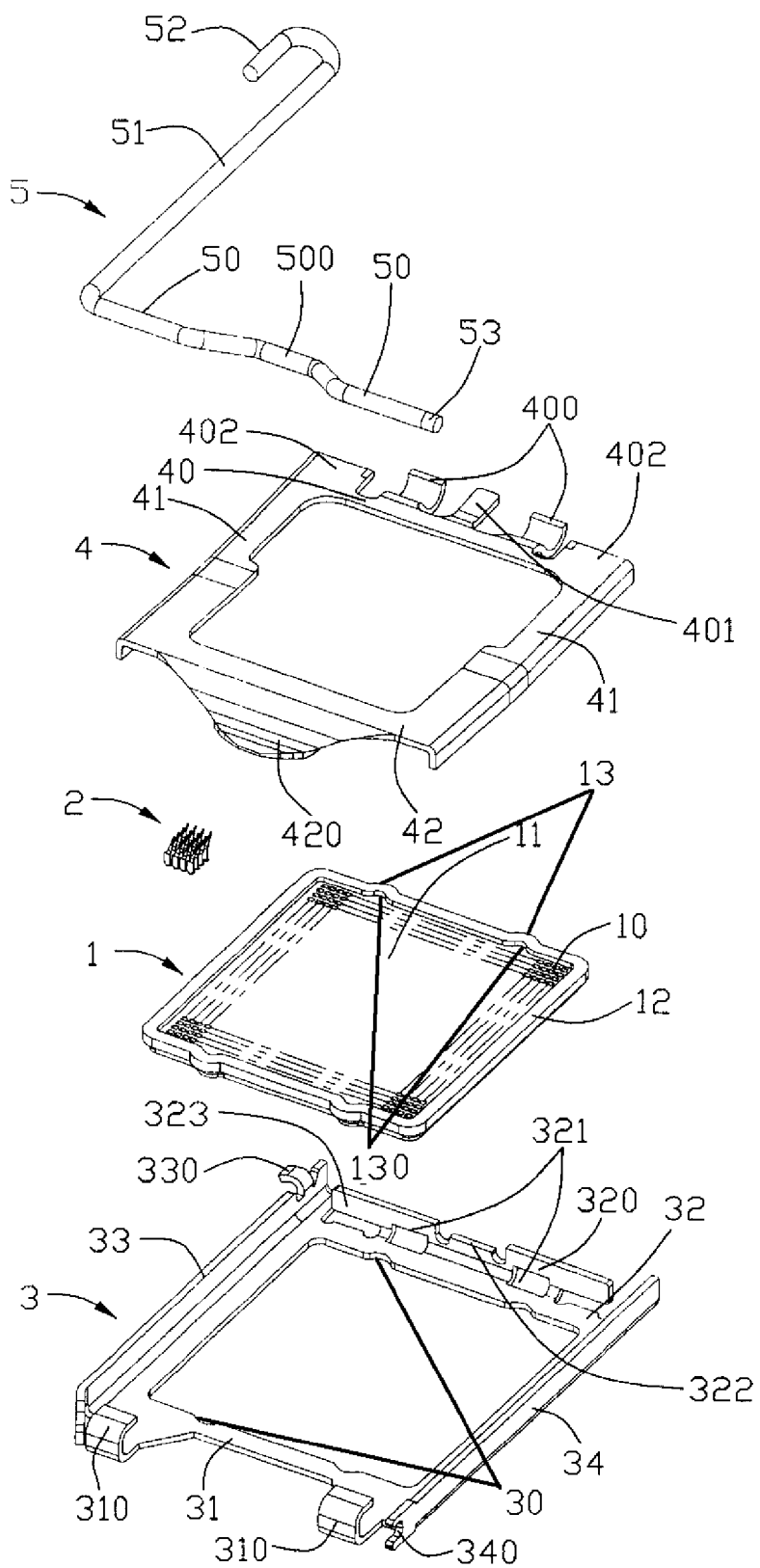
FIG. 2 is an exploded, perspective view of the electrical connector shown in FIG. 1.

Please refer to FIGS. 1-2, an electrical connector in accordance with the present invention is a typical connector of Land Grid Array (LGA) for electrically connecting a chip module, such as a Central Processing Unit (CPU, not shown), to a printed circuit board (not shown). The electrical connector comprises an insulative housing 1, a plurality of contacts 2 secured in the insulative housing 1, a metal stiffener 3 surrounding the insulative housing 1, a metal clip 4 pivotally assembled to one end of the metal stiffener 3, and a lever 5 pivotally assembled to the other end of the metal stiffener 3 for engaging with the metal clip 4.

The insulative housing 1 is substantially of rectangular shaped and comprises a body portion 11 and a plurality of sidewalls 12 extending upwardly from the body portion 11. The insulative housing 1 comprises opposite upper and lower surfaces served as mounting surface and connecting surface (not labeled) to which the chip module and the printed circuit board are mounted, respectively. The body portion 11 defines a plurality of passageways 10 for receiving the contacts 2, respectively. The sidewalls 12 define a receiving space (not labeled) together with the body portion 11 for receiving the chip module.

Upper and opposite lower ends of each contact are respectively connected to the chip module and the printed circuit board.

The metal stiffener 3 has a flat base plate and defines a window (not labeled) in the center thereof for receiving the insulative housing 1. Two opposite edges 31, 32 of the metal stiffener 3 respectively upward extend to form a receiving portion 310 for pivotally receiving the lever 5 and a mounting portion 320 for pivotally mounting the metal clip 4. The other two opposite edges of the metal stiffener 3 forms two sidewalls 33, 34 facing to each other with one sidewall 33 formed with a stopper 330 for restricting the lever 5. A locking portion 340 is formed on the sidewall 34 for positioning the lever 5. The receiving portion 310 includes a pair of retaining tabs extending upwardly and then bending laterally. The mounting portion 320 is a vertical wall bending from the base plate and defines a pair of retaining recesses 321 and a cutout 322 located therebetween. The stiffener 3 defines a plurality of notches 30 along a periphery of the window, and the housing 1 defines a plurality of protrusions 13 on a corresponding circumference to be engaged within the corresponding notches 30, respectively, and each of said protrusions 13 defines a recess 130 inwardly communicating with the receiving space, under condition that a shape of the recess 130 is compliant with an exterior contour of the protrusion 13.

The lever 5 is substantially L-shaped and comprises an engaging portion 50 assembled to the metal stiffener 3 and an operating portion 51 perpendicular to the engaging portion 50. The engaging portion 50 has a cam portion 500 to press the metal clip 4 and an end portion 53 locked with the locking portion 340 of the metal stiffener 3. A grasp portion 52 is provided on the free end of the operating portion 51.

The metal clip 4 is of a substantially flat board and comprises a main portion 41 pivotally covering upper surface of the electrical chip. The main portion 41 comprises an engaging tab 420 extending arcuately from an end 42 thereof and a pair of spaced hooks 400 formed at the opposite end 40 thereof for pivotally retaining to the retaining recesses 321 of the mounting portion 320. The cam portion 500 presses on the engaging tab 420 to reliably retain the chip module to the insulative housing 1. A tail portion 401 is disposed between the pair of hooks 400 to limit the rotation of the metal clip 4. The metal clip 4 is provided with a pair of extending portions 402 projecting laterally from the main portion 41 and adjacent to the hooks 400. The metal stiffener 3 forms a pair of vertical block portions 323 corresponding to the extending portions 402.

After assembly, the lever 5 is pivotally received in the receiving portion 310 of the metal stiffener 3 and the metal clip 4 is pivotally mounting to the mounting portion 320 of the stiffener 3. The insulative housing 1 is assembled to the metal stiffener 3. The metal clip 4 is rotated relative to the stiffener 3 from an open position to a closes position. After the metal clip 4 contacts with the clip module, the lever 5 is rotated until the cam portion 500 presses the engage tab 420. Then, the operation portion 51 latches with the stopper 330 of the stiffener 3, thus, realizing the electrical connection between the chip module and the printed circuit board.

The block portions 323 are located at outside of the extending portions 402 so as to contact therewith during closing the lever 5 to the metal clip 4. Therefore, when the cam portion 500 presses the engaging tab 41, the block portions 323 can limit lateral movement of the metal clip 4 and resist a horizontal force exerted by the lever 5. Therefore, the lever can securely engage with the engaging tab 420.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for electrically connecting a chip module to a printed circuit board, comprising:
    an insulative housing defining a plurality of contact-receiving passageways penetrating therethrough;
    a plurality of contacts received in the contact-receiving passageways of the insulative housing;
    a metal stiffener surrounding the insulative housing and comprising a base plate with a window in the center thereof;
    a metal clip pivotally assembled to one end of the metal stiffener and comprising a main portion, an engaging tab extending angularly from the main portion, and a pair of hooks opposite to the engaging tab and mounting to the metal stiffener; and
    a lever pivotally assembled to the other end of the metal stiffener and comprising a cam portion engaging with the engaging tab of the metal clip; wherein the metal clip includes
    a tail portion between the pair of hooks engaging with the stiffener to limit the rotation of the clip and a pair of extending portions at outer sides of the hooks respectively, and the metal stiffener includes;
    inner surfaces of a pair of block portions abutting against outer surfaces of the extending portions of the clip; wherein
    the extending portions extend laterally from the main portion and are apart from the hooks; wherein
    said metal stiffener defines the window to receive said housing with a plurality of notches along a periphery thereof, and the housing defines a plurality of protrusions on a corresponding circumference to be engaged within the corresponding notches, respectively, and each of said protrusions defines a recess inwardly communicating with a receiving space in an upper surface of the housing; and wherein
    a shape of the recess is compliant with an exterior contour of the protrusion.

2. The electrical connector as claimed in claim 1, wherein the insulative housing comprises a body portion and a plurality of sidewalls upwardly extending from the body portion.

3. The electrical connector as claimed in claim 1, wherein the metal stiffener comprises a pair of retaining tabs extending upwardly from the base plate for receiving the lever, and a mounting portion for mounting the metal clip.

4. The electrical connector as claimed in claim 3, wherein the mounting portion comprises a vertical wall bent from the base plate and defines a pair of retaining recesses engaging with the hooks of the metal clip.

5. The electrical connector as claimed in claim 4, wherein the block portions are formed on the mounting portion of the metal stiffener for limiting a lateral movement of the metal clip.

6. An LGA (Land Grid Array) connector comprising:
    an insulative housing defining a plurality of contact-receiving passageways along up-to-down direction;
    a plurality of contacts received in the contact-receiving passageways of the insulative housing;
    a metal stiffener surrounding the insulative housing and comprising a base plate with a window thereon;
    a metal clip comprising a main portion, an engaging tab extending from the main portion, and a pair of hooks pivotally assembled to a first end of the metal stiffener; and
    a lever pivotally assembled to a second end of the metal stiffener for pressing the engaging tab of the metal clip; wherein
    the metal stiffener includes a block portion engaging with the main portion to limit the metal clip moving from said second end to said first end when the lever presses onto the engaging tab; wherein
    the main portion has an extending portion extends horizontally therefrom and is apart from the hooks, and wherein an outer surface of the extending portion abuts against an inner surface of the block portion of the metal stiffener; wherein said metal stiffener defines the window to receive said housing with a plurality of notches along a periphery thereof, and the housing defines a plurality of protrusions on a corresponding circumference to be engaged within the corresponding notches, respectively, and each of said protrusions defines a recess inwardly communicating with a receiving space in an upper surface of the housing ; and wherein a shape of the recess is compliant with an exterior contour of the protrusion.

7. The LGA connector as claimed in claim 6, wherein the insulative housing comprises a body portion and a plurality of sidewalls upwardly extending from the body portion.

8. The LGA connector as claimed in claim 6, wherein the metal stiffener comprises a pair of retaining tabs extending upwardly from the base plate for receiving the lever, and a mounting portion for mounting the metal clip.

9. The LGA connector as claimed in claim 8, wherein the mounting portion upwardly bends from the base plate and defines a pair of retaining recesses engaging with the hooks of the metal clip.

10. The LGA connector as claimed in claim 9, wherein the block portion is formed on the mounting portion and located at outer side of the retaining recesses.

11. An LGA connector comprising:
   an insulative housing defining a receiving space in an upper face;
   a plurality of contacts disposed in the housing with contacting sections extending upwardly into the receiving space;
   a lever mounting region and a clip mounting region respectively located by two opposite front and rear ends of the housing along a front-to-back direction;
   a lever pivotally mounted to the lever mounting region; and
   a clip pivotally mounted to the clip mounting region, a free distal end of the clip being moveable around the lever mounting region and downwardly depressed by the lever; wherein
   the clip mounting region provides an abutment face forwardly engages the clip, and the clip includes a curved hook at a root portion to rotatably received in a corresponding retaining recess in the clip mounting region, and the abutment face is located beside said retaining recess; wherein
   the clip has a main portion that has an extending portion extends horizontally therefrom and is apart from the curved hook, and wherein an outer surface of the extending portion abuts against the abutment face of the clip mounting region; wherein
   said lever mounting region and said clip mounting region are unitarily formed as a one piece stiffener; wherein
   the clip forms a curved engaging tab at the free distal end and the lever engages said engaging tab to push the clip rearwardly so as to push the clip toward said abutment face; wherein
   said one piece stiffener defines a window to receive said housing with a plurality of notches along a periphery thereof, and the housing defines a plurality of protrusions on a corresponding circumference to be engaged within the corresponding notches, respectively, and each of said protrusions defines a recess inwardly communicating with the receiving space; and wherein
   a shape of the recess is compliant with an exterior contour of the protrusion.

* * * * *